(12) United States Patent
Xiao et al.

(10) Patent No.: US 9,818,357 B2
(45) Date of Patent: *Nov. 14, 2017

(54) GOA CIRCUIT AND LIQUID CRYSTAL DISPLAY DEVICE

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Juncheng Xiao, Guangdong (CN); Mang Zhao, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 220 days.

This patent is subject to a terminal disclaimer.

(21) Appl. No.: 14/787,299

(22) PCT Filed: Aug. 28, 2015

(86) PCT No.: PCT/CN2015/088379
§ 371 (c)(1),
(2) Date: Oct. 27, 2015

(87) PCT Pub. No.: WO2017/031774
PCT Pub. Date: Mar. 2, 2017

(65) Prior Publication Data
US 2017/0256217 A1  Sep. 7, 2017

(30) Foreign Application Priority Data
Aug. 21, 2015 (CN) .......................... 2015 1 0520861

(51) Int. Cl.
*G09G 3/36* (2006.01)

(52) U.S. Cl.
CPC ... *G09G 3/3677* (2013.01); *G09G 2300/0809* (2013.01)

(58) Field of Classification Search
CPC .................... G09G 3/3677; G09G 2300/0809
See application file for complete search history.

(56) References Cited

U.S. PATENT DOCUMENTS

2010/0079443 A1* 4/2010 Chang .................. G09G 3/3677
345/214
2014/0035889 A1* 2/2014 Huang ..................... G09G 3/00
345/204

(Continued)

FOREIGN PATENT DOCUMENTS

CN  101383133 A   3/2009
CN  103714792 A   4/2014

(Continued)

*Primary Examiner* — Kumar Patel
*Assistant Examiner* — Amy C Onyekaba
(74) *Attorney, Agent, or Firm* — Andrew C. Cheng

(57) ABSTRACT

A GOA circuit and an LCD are disclosed. The GOA circuit includes multiple cascaded GOA units and a control module. Each of the multiple cascaded GOA units is used for charging a corresponding horizontal scanning line in a display area through driving of a first stage-transferring clock, a second stage-transferring clock, a first control clock and a second control clock. The control module is used to control the gate driving signals to be reset to the first voltage level, that is an ineffective voltage level, after the GOA circuit finishes a charging for all of the horizontal scanning lines simultaneously through the starting pulse signal such that a redundant pulse signal generated on the horizontal scanning lines before the gate driving signal of the first stage GOA unit is outputted is avoided in order to ensure a normal operation of the GOA circuit.

20 Claims, 5 Drawing Sheets

(56) References Cited

U.S. PATENT DOCUMENTS

| | | | |
|---|---|---|---|
| 2014/0062979 A1 | 3/2014 | Liu et al. | |
| 2015/0213762 A1* | 7/2015 | Xia | G09G 3/3266 345/215 |
| 2016/0086562 A1* | 3/2016 | Tan | G09G 3/3677 345/215 |
| 2016/0189586 A1 | 6/2016 | Zou et al. | |
| 2016/0267832 A1* | 9/2016 | Dai | G09G 3/2092 |
| 2016/0365054 A1* | 12/2016 | Wu | G11C 19/28 |

FOREIGN PATENT DOCUMENTS

| | | |
|---|---|---|
| CN | 104318908 A | 1/2015 |
| JP | 2002-197885 A | 7/2002 |
| KR | 20050049796 A | 5/2005 |

\* cited by examiner

GOA CIRCUIT AND LIQUID CRYSTAL DISPLAY DEVICE

BACKGROUND OF THE INVENTION

1. Field of the Invention

The present invention relates to a liquid crystal technology field, and more particularly to a GOA circuit and a liquid crystal display device.

2. Description of Related Art

When using a conventional GOA (Gate driver on array) circuit with an All-Gate-On function, because a bootstrap capacitor is existed, after finishing the All-Gate-On function, a gate driving signal in the GOA circuit will not become an ineffective voltage level. Accordingly, a redundant gate driving signal is existed so as to lead a failure of the GOA circuit.

Wherein, the All-Gate-On function is to set all of the gate driving signal in the GOA circuit to be in an effective voltage level in order to charge all horizontal scanning lines simultaneously so that remaining electric charges in each pixel point of a liquid crystal display device can be removed in order to solve a ghosting image generated when turning on or turning off the liquid crystal display device.

SUMMARY OF THE INVENTION

The main technology solved by the present invention is to provide a GOA circuit and a liquid crystal display device in order to avoid generating a redundant pulse signal generated on the horizontal scanning lines before the gate driving signal of the first stage GOA unit is outputted is avoided.

In order to solve the above technology problem, a technology solution adopted by the present invention is: a Gate on Array (GOA) circuit applied in a liquid crystal display device, comprising: multiple cascaded GOA units, wherein, each of the multiple cascaded GOA units is used for charging a corresponding horizontal scanning line through driving of a first stage-transferring clock, a second stage-transferring clock, a first control clock and a second control clock; the first stage-transferring clock and the second stage-transferring clock are used to control an inputting of a stage-transferring signal of the GOA unit and a generation of a gate driving signal of the GOA unit; the first control clock and the second control clock are used to control the gate driving signal to be in a first voltage level; wherein, the stage-transferring signal is a starting pulse signal or a gate driving signal of an adjacent GOA unit;

the GOA unit includes a forward and backward scanning unit, an input control unit, a pull-up holding unit, an output control unit, a GAS (gate-all-select) signal function unit and a bootstrap capacitor unit; the forward and backward scanning unit is used for controlling a forward driving or a backward driving of the GOA circuit, and under the control of the first control clock and the second control clock, controlling a common signal node to be held in a second voltage level; the input control unit is used for controlling the inputting of the stage-transferring signal according to the first stage-transferring clock in order to finish a charging of a gate signal node; the pull-up holing unit is used for controlling the gate signal node to be held in a first voltage level in a non-operation period according to the common signal node; the output control unit is used for controlling an outputting of the gate driving signal corresponding to the gate signal node according to the second stage-transferring clock; the GAS signal function unit is used for controlling the gate driving signal to be in the second voltage level in order to realize the charging of the horizontal scanning line corresponding to the GOA unit; and the bootstrap capacitor is used for boosting a voltage of the gate signal node again;

the forward and backward scanning unit includes a first transistor, a second transistor, a third transistor and a fourth transistor; a gate of the first transistor receives a first scanning control signal; a source of the first transistor receives a gate driving signal outputted from a next stage GOA unit; a gate of the second transistor receives a second scanning control signal; a source of the second transistor receives a gate driving signal outputted from a previous stage GOA unit; a drain of the first transistor and a drain of the second transistor are connected with each other and are connected with the input control unit; a gate of the third transistor receives the first control clock; a gate of the fourth transistor receives the second scanning control signal; a source of the fourth transistor receives the second control clock; a drain of the third transistor and a drain of the fourth transistor are connected with each other and are connected with the pull-up holding unit; the input control unit includes a fifth transistor; a gate of the fifth transistor receives the first stage-transferring clock; a source of the fifth transistor is connected with a drain of the first transistor and a drain of the second transistor; a drain of the fifth transistor is connected with the gate signal node; the pull-up holding unit includes a sixth transistor, a seventh transistor, a ninth transistor, a tenth transistor and a first capacitor; a gate of the sixth transistor is connected with the common signal node; a source of the sixth transistor is connected with a drain of the fifth transistor; a drain of the sixth transistor is connected with a first constant voltage source; a gate of the seventh transistor is connected with a drain of the fifth transistor; a source of the seventh transistor is connected with the common signal node; a drain of the seventh transistor is connected with the first constant voltage source, that is, the positive constant voltage source; a gate of the ninth transistor is connected with a drain of the third transistor and a drain of the fourth transistor; a source of the ninth transistor is connected with a second constant voltage source; a drain of the ninth transistor is connected with the common signal node; a gate of the ninth transistor is connected with the common signal node; a source of the ninth transistor is connected with the gate driving signal; a drain of the tenth transistor is connected with the first constant voltage source; one terminal of the first capacitor is connected with the first constant voltage source; the other terminal of the first capacitor is connected with the common signal node; the output control unit includes an eleventh transistor and a second capacitor; a gate of the eleventh transistor is connected with the gate signal node; a drain of the eleventh transistor is connected with the gate driving signal; a source of the eleventh transistor receives the second stage-transferring clock; one terminal of the second capacitor is connected with the gate signal node; the other terminal of the second capacitor is connected with the gate driving signal; the GAS (gate-all-select) signal function unit includes a thirteenth transistor and a fourteenth transistor; a gate of the thirteenth transistor, a gate and a drain of the fourteenth transistor receive a GAS signal; a drain of the thirteenth transistor is connected with the first constant voltage source; a source of the thirteenth transistor is connected with the common signal node; a source of the of the thirteenth transistor is connected with the gate driving signal; the bootstrap capacitor unit includes a bootstrap capacitor; one terminal of the bootstrap capacitor is connected with the gate driving signal, and the other terminal of the bootstrap capacitor is connected to a ground signal; the GOA unit further includes a voltage regulation unit and a pull-up auxiliary unit; the voltage regulation unit includes an eighth transistor; the eighth transistor is connected in series between a source of the fifth transistor and the gate signal node; a gate of the eighth transistor is connected with the second constant voltage source; a drain of the eighth transistor and a drain of the fifth transistor are connected; a source of the eighth transistor is connected with the gate signal node; the pull-up auxiliary unit includes a twelfth transistor; a gate of the twelfth transistor is connected with the drain of the first transistor and a drain of the second transistor; a source of the twelfth transistor is connected with the common signal node; a drain of the twelfth transistor is connected with the positive constant voltage source;

the GOA circuit further includes a control module used to control the gate driving signals except the gate driving signal of the first stage GOA unit to be reset to the first voltage level after the GOA circuit finishes a charging for all of the horizontal scanning lines simultaneously through the starting pulse signal such that a redundant pulse signal generated on the horizontal scanning lines before the gate driving signal of the first stage GOA unit is outputted is avoided; and the control module includes multiple first control transistors corresponding to the GOA units one by one except the first stage GOA unit; a first terminal and a second terminal of each first control transistor are connected to receive the starting pulse signal; a third terminal of each first control transistor is connected with the common signal node of a corresponding GOA unit.

Wherein, each first control transistor is a PMOS transistor; a first terminal, a second terminal and a third terminal of the first control transistor are corresponding to a gate, a source and a drain of the PMOS transistor; when the starting pulse signal is turned on, the starting pulse signal controls the common signal node of each GOA unit except the first stage GOA unit to be located in a low voltage level such that the gate driving signals on the horizontal scanning lines are reset to high voltage levels.

In order to solve the above technology problem, another technology adopted by the present invention is: a Gate on Array (GOA) circuit applied in a liquid crystal display device, comprising: multiple cascaded GOA units, wherein, each of the multiple cascaded GOA units is used for charging a corresponding horizontal scanning line through driving of a first stage-transferring clock, a second stage-transferring clock, a first control clock and a second control clock; the first stage-transferring clock and the second stage-transferring clock are used to control an inputting of a stage-transferring signal of the GOA unit and a generation of a gate driving signal of the GOA unit; the first control clock and the second control clock are used to control the gate driving signal to be in a first voltage level; wherein, the stage-transferring signal is a starting pulse signal or a gate driving signal of an adjacent GOA unit; and a control module used to control the gate driving signals except the gate driving signal of the first stage GOA unit to be reset to the first voltage level after the GOA circuit finishes a charging for all of the horizontal scanning lines simultaneously through the starting pulse signal such that a redundant pulse signal generated on the horizontal scanning lines before the gate driving signal of the first stage GOA unit is outputted is avoided.

Wherein, the GOA unit includes a forward and backward scanning unit, an input control unit, a pull-up holding unit, an output control unit, a GAS (gate-all-select) signal function unit and a bootstrap capacitor unit; the forward and backward scanning unit is used for controlling a forward driving or a backward driving of the GOA circuit, and under the control of the first control clock and the second control clock, controlling a common signal node to be held in a second voltage level; the input control unit is used for controlling the inputting of the stage-transferring signal according to the first stage-transferring clock in order to finish a charging of a gate signal node; the pull-up holing unit is used for controlling the gate signal node to be held in a first voltage level in a non-operation period according to the common signal node; the output control unit is used for controlling an outputting of the gate driving signal corresponding to the gate signal node according to the second stage-transferring clock; the GAS signal function unit is used for controlling the gate driving signal to be in the second voltage level in order to realize the charging of the horizontal scanning line corresponding to the GOA unit; and the bootstrap capacitor is used for boosting a voltage of the gate signal node again.

Wherein, the control module includes multiple first control transistors corresponding to the GOA units one by one except the first stage GOA unit; a first terminal and a second terminal of each first control transistor are connected to receive the starting pulse signal; a third terminal of each first control transistor is connected with a common signal node of a corresponding GOA unit.

Wherein, each first control transistor is a PMOS transistor; a first terminal, a second terminal and a third terminal of the first control transistor are corresponding to a gate, a source and a drain of the PMOS transistor; when the starting pulse signal is turned on, the starting pulse signal controls the common signal node of each GOA unit except the first stage GOA unit to be located in a low voltage level such that the gate driving signals on the horizontal scanning lines are reset to high voltage levels.

Wherein, each first control transistor is a NMOS transistor; a first terminal, a second terminal and a third terminal of the first control transistor are corresponding to a gate, a source and a drain of the NMOS transistor; when the starting pulse signal is turned on, the starting pulse signal controls the common signal node of each GOA unit except the first stage GOA unit to be located in a high voltage level such that the gate driving signals on the horizontal scanning lines are reset to low voltage levels.

Wherein, the control module includes a second control transistor; a first terminal and a second terminal of the second control transistor are connected to receive the staring pulse signal; a third terminal of the second control transistor is connected with the common signal nodes of the multiple GOA units except the first stage GOA unit.

Wherein, the second control transistor is a PMOS transistor; a first terminal, a second terminal and a third terminal of the second control transistor are corresponding to a gate, a source and a drain of the PMOS transistor; when the starting pulse signal is turned on, the starting pulse signal controls the common signal node of each GOA unit except the first stage GOA unit to be located in a low voltage level such that the gate driving signals on the horizontal scanning lines are reset to high voltage levels.

Wherein, the second control transistor is a NMOS transistor; a first terminal, a second terminal and a third terminal of the second control transistor are corresponding to a gate, a source and a drain of the NMOS transistor; when the starting pulse signal is turned on, the starting pulse signal controls the common signal node of each GOA unit except the first stage GOA unit to be located in a high voltage level such that the gate driving signals on the horizontal scanning lines are reset to low voltage levels.

Wherein, the forward and backward scanning unit includes a first transistor, a second transistor, a third transistor and a fourth transistor; a gate of the first transistor receives a first scanning control signal; a source of the first transistor receives a gate driving signal outputted from a next stage GOA unit; a gate of the second transistor receives a second scanning control signal; a source of the second transistor receives a gate driving signal outputted from a previous stage GOA unit; a drain of the first transistor and a drain of the second transistor are connected with each other and are connected with the input control unit; a gate of the third transistor receives the first control clock; a gate of the fourth transistor receives the second scanning control signal; a source of the fourth transistor receives the second control clock; a drain of the third transistor and a drain of the fourth transistor are connected with each other and are connected with the pull-up holding unit; the input control unit includes a fifth transistor; a gate of the fifth transistor receives the first stage-transferring clock; a source of the fifth transistor is connected with a drain of the first transistor and a drain of the second transistor; a drain of the fifth transistor is connected with the gate signal node; the pull-up holding unit includes a sixth transistor, a seventh transistor, a ninth transistor, a tenth transistor and a first capacitor; a gate of the sixth transistor is connected with the common signal node; a source of the sixth transistor is connected with a drain of the fifth transistor; a drain of the sixth transistor is connected with a first constant voltage source; a gate of the seventh transistor is connected with a drain of the fifth transistor; a source of the seventh transistor is connected with the common signal node; a drain of the seventh transistor is connected with the first constant voltage source, that is, the positive constant voltage source; a gate of the ninth transistor is connected with a drain of the third transistor and a drain of the fourth transistor; a source of the ninth transistor is connected with a second constant voltage source; a drain of the ninth transistor is connected with the common signal node; a gate of the ninth transistor is connected with the common signal node; a source of the ninth transistor is connected with the gate driving signal; a drain of the tenth transistor is connected with the first constant voltage source; one terminal of the first capacitor is connected with the first constant voltage source; the other terminal of the first capacitor is connected with the common signal node; the output control unit includes an eleventh transistor and a second capacitor; a gate of the eleventh transistor is connected with the gate signal node; a drain of the eleventh transistor is connected with the gate driving signal; a source of the eleventh transistor receives the second stage-transferring clock; one terminal of the second capacitor is connected with the gate signal node; the other terminal of the second capacitor is connected with the gate driving signal; the GAS (gate-all-select) signal function unit includes a thirteenth transistor and a fourteenth transistor; a gate of the thirteenth transistor, a gate and a drain of the fourteenth transistor receive a GAS signal; a drain of the thirteenth transistor is connected with the first constant voltage source; a source of the thirteenth transistor is connected with the common signal node; a source of the of the thirteenth transistor is connected with the gate driving signal; the bootstrap capacitor unit includes a bootstrap capacitor; one terminal of the bootstrap capacitor is connected with the gate driving signal, and the other terminal of the bootstrap capacitor is connected to a ground signal; and the GOA unit further includes a voltage regulation unit and a pull-up auxiliary unit; the voltage regulation unit includes an eighth transistor; the eighth transistor is connected in series between a source of the fifth transistor and the gate signal node; a gate of the eighth transistor is connected with the second constant voltage source; a drain of the eighth transistor and a drain of the fifth transistor are connected; a source of the eighth transistor is connected with the gate signal node; the pull-up auxiliary unit includes a twelfth transistor; a gate of the twelfth transistor is connected with the drain of the first transistor and a drain of the second transistor; a source of the twelfth transistor is connected with the common signal node; a drain of the twelfth transistor is connected with the positive constant voltage source.

In order to solve the above technology problem, another technology solution adopted by the present invention is: a liquid crystal display device including a Gate on Array (GOA) circuit, and the GOA circuit comprises: multiple cascaded GOA units, wherein, each of the multiple cascaded GOA units is used for charging a corresponding horizontal scanning line through driving of a first stage-transferring clock, a second stage-transferring clock, a first control clock and a second control clock; the first stage-transferring clock and the second stage-transferring clock are used to control an inputting of a stage-transferring signal of the GOA unit and a generation of a gate driving signal of the GOA unit; the first control clock and the second control clock are used to control the gate driving signal to be in a first voltage level; wherein, the stage-transferring signal is a starting pulse signal or a gate driving signal of an adjacent GOA unit; and a control module used to control the gate driving signals except the gate driving signal of the first stage GOA unit to be reset to the first voltage level after the GOA circuit finishes a charging for all of the horizontal scanning lines simultaneously through the starting pulse signal such that a redundant pulse signal generated on the horizontal scanning lines before the gate driving signal of the first stage GOA unit is outputted is avoided.

Wherein, the GOA unit includes a forward and backward scanning unit, an input control unit, a pull-up holding unit, an output control unit, a GAS (gate-all-select) signal function unit and a bootstrap capacitor unit; the forward and backward scanning unit is used for controlling a forward driving or a backward driving of the GOA circuit, and under the control of the first control clock and the second control clock, controlling a common signal node to be held in a second voltage level; the input control unit is used for controlling the inputting of the stage-transferring signal according to the first stage-transferring clock in order to finish a charging of a gate signal node; the pull-up holing unit is used for controlling the gate signal node to be held in a first voltage level in a non-operation period according to the common signal node; the output control unit is used for controlling an outputting of the gate driving signal corresponding to the gate signal node according to the second stage-transferring clock; the GAS signal function unit is used for controlling the gate driving signal to be in the second voltage level in order to realize the charging of the horizontal scanning line corresponding to the GOA unit; and the bootstrap capacitor is used for boosting a voltage of the gate signal node again.

Wherein, the control module includes multiple first control transistors corresponding to the GOA units one by one except the first stage GOA unit; a first terminal and a second terminal of each first control transistor are connected to receive the starting pulse signal; a third terminal of each first control transistor is connected with a common signal node of a corresponding GOA unit.

Wherein, each first control transistor is a PMOS transistor; a first terminal, a second terminal and a third terminal of the first control transistor are corresponding to a gate, a source and a drain of the PMOS transistor; when the starting pulse signal is turned on, the starting pulse signal controls the common signal node of each GOA unit except the first stage GOA unit to be located in a low voltage level such that the gate driving signals on the horizontal scanning lines are reset to high voltage levels.

Wherein, each first control transistor is a NMOS transistor; a first terminal, a second terminal and a third terminal of the first control transistor are corresponding to a gate, a source and a drain of the NMOS transistor; when the starting pulse signal is turned on, the starting pulse signal controls the common signal node of each GOA unit except the first stage GOA unit to be located in a high voltage level such that the gate driving signals on the horizontal scanning lines are reset to low voltage levels.

Wherein, the control module includes a second control transistor; a first terminal and a second terminal of the second control transistor are connected to receive the staring pulse signal; a third terminal of the second control transistor is connected with the common signal nodes of the multiple GOA units except the first stage GOA unit.

Wherein, the second control transistor is a PMOS transistor; a first terminal, a second terminal and a third terminal of the second control transistor are corresponding to a gate, a source and a drain of the PMOS transistor; when the starting pulse signal is turned on, the starting pulse signal controls the common signal node of each GOA unit except the first stage GOA unit to be located in a low voltage level such that the gate driving signals on the horizontal scanning lines are reset to high voltage levels.

Wherein, the second control transistor is a NMOS transistor; a first terminal, a second terminal and a third terminal of the second control transistor are corresponding to a gate, a source and a drain of the NMOS transistor; when the starting pulse signal is turned on, the starting pulse signal controls the common signal node of each GOA unit except the first stage GOA unit to be located in a high voltage level such that the gate driving signals on the horizontal scanning lines are reset to low voltage levels.

Wherein, the forward and backward scanning unit includes a first transistor, a second transistor, a third transistor and a fourth transistor; a gate of the first transistor receives a first scanning control signal; a source of the first transistor receives a gate driving signal outputted from a next stage GOA unit; a gate of the second transistor receives a second scanning control signal; a source of the second transistor receives a gate driving signal outputted from a previous stage GOA unit; a drain of the first transistor and a drain of the second transistor are connected with each other and are connected with the input control unit; a gate of the third transistor receives the first control clock; a gate of the fourth transistor receives the second scanning control signal; a source of the fourth transistor receives the second control clock; a drain of the third transistor and a drain of the fourth transistor are connected with each other and are connected with the pull-up holding unit; the input control unit includes a fifth transistor; a gate of the fifth transistor receives the first stage-transferring clock; a source of the fifth transistor is connected with a drain of the first transistor and a drain of the second transistor; a drain of the fifth transistor is connected with the gate signal node; the pull-up holding unit includes a sixth transistor, a seventh transistor, a ninth transistor, a tenth transistor and a first capacitor; a gate of the sixth transistor is connected with the common signal node; a source of the sixth transistor is connected with a drain of the fifth transistor; a drain of the sixth transistor is connected with a first constant voltage source; a gate of the seventh transistor is connected with a drain of the fifth transistor; a source of the seventh transistor is connected with the common signal node; a drain of the seventh transistor is connected with the first constant voltage source, that is, the positive constant voltage source; a gate of the ninth transistor is connected with a drain of the third transistor and a drain of the fourth transistor; a source of the ninth transistor is connected with a second constant voltage source; a drain of the ninth transistor is connected with the common signal node; a gate of the ninth transistor is connected with the common signal node; a source of the ninth transistor is connected with the gate driving signal; a drain of the tenth transistor is connected with the first constant voltage source; one terminal of the first capacitor is connected with the first constant voltage source; the other terminal of the first capacitor is connected with the common signal node; the output control unit includes an eleventh transistor and a second capacitor; a gate of the eleventh transistor is connected with the gate signal node; a drain of the eleventh transistor is connected with the gate driving signal; a source of the eleventh transistor receives the second stage-transferring clock; one terminal of the second capacitor is connected with the gate signal node; the other terminal of the second capacitor is connected with the gate driving signal; the GAS (gate-all-select) signal function unit includes a thirteenth transistor and a fourteenth transistor; a gate of the thirteenth transistor, a gate and a drain of the fourteenth transistor receive a GAS signal; a drain of the thirteenth transistor is connected with the first constant voltage source; a source of the thirteenth transistor is connected with the common signal node; a source of the of the thirteenth transistor is connected with the gate driving signal; the bootstrap capacitor unit includes a bootstrap capacitor; one terminal of the bootstrap capacitor is connected with the gate driving signal, and the other terminal of the bootstrap capacitor is connected to a ground signal; and the GOA unit further includes a voltage regulation unit and a pull-up auxiliary unit; the voltage regulation unit includes an eighth transistor; the eighth transistor is connected in series between a source of the fifth transistor and the gate signal node; a gate of the eighth transistor is connected with the second constant voltage source; a drain of the eighth transistor and a drain of the fifth transistor are connected; a source of the eighth transistor is connected with the gate signal node; the pull-up auxiliary unit includes a twelfth transistor; a gate of the twelfth transistor is connected with the drain of the first transistor and a drain of the second transistor; a source of the twelfth transistor is connected with the common signal node; a drain of the twelfth transistor is connected with the positive constant voltage source.

The beneficial effect of the present invention is: the GOA circuit and the liquid crystal display device of the present invention, through the starting pulse signal to control the gate driving signals to be reset to the first voltage level, that is, an ineffective voltage level, after the GOA circuit finishes a charging for all of the horizontal scanning lines simultaneously such that a redundant pulse signal generated on the horizontal scanning lines before the gate driving signal of the first stage GOA unit is outputted is avoided.

DETAILED DESCRIPTION OF THE PREFERRED EMBODIMENT

In the embodiment and claims of the present invention, some vocabularies are used to indicate some specific elements. A person skilled in the art can understand that manufacturers may use a different vocabulary to indicate a same element. The present embodiment and claims do not use the difference in the vocabularies to distinguish the elements. The present embodiment and claims utilize the difference in the functions of the elements to distinguish the elements. The following content combines with the drawings and the embodiment for describing the present invention in detail.

Figure 1:
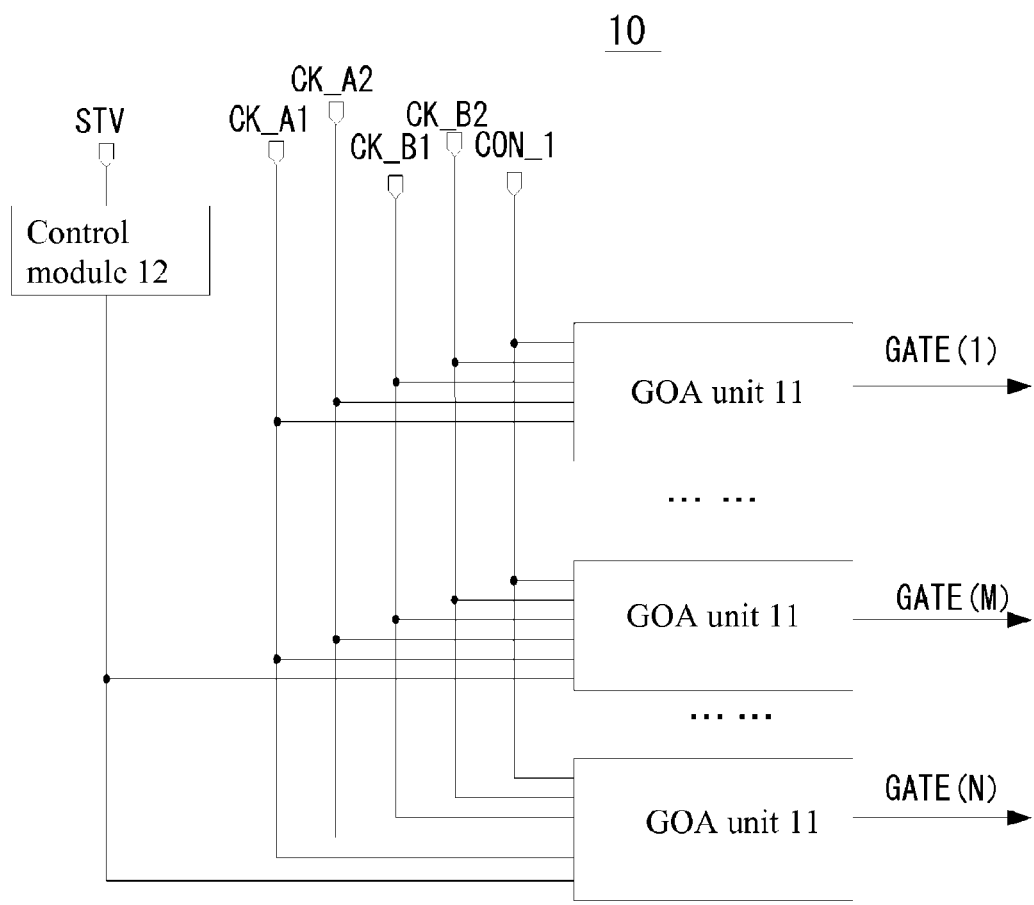
FIG. 1 is a schematic structure diagram of a GOA circuit according to a first embodiment of the present invention.

FIG. 1 is a schematic structure diagram of a GOA circuit according to a first embodiment of the present invention. As shown in FIG. 1, a GOA circuit 10 includes multiple cascaded GOA units 11 and a control module 12.

Each of the GOA units 11 is used for charging a corresponding horizontal scanning line through driving by a first stage-transferring clock CK_A1, a second stage-transferring clock CK_A2, a first control clock CK_B1 and a second control clock CK_B2. Wherein, the first stage-transferring clock CK_A1 and the second stage-transferring clock CK_A2 are used to control an inputting of a stage-transferring signal CON_1 of the GOA unit 11 and a generation of a gate driving signal GATE (N) (N is a natural number) of the GOA unit 11. The first control clock CK_B1 and the second control clock CK_B2 are used to control the gate driving signal GATE (N) to be in a first voltage level, that is, a disable voltage level. Wherein, the stage-transferring signal CON_1 is a starting pulse signal or a gate driving signal of an adjacent GOA unit 11.

The control module 12 is connected with the starting pulse signal STV and the multiple cascaded GOA units 11 except a first stage GOA unit 11. The control module 12 is used to control gate driving signals GATE (N) except a gate driving signal GATE (1) of the first stage GOA unit 11 to be reset to the first voltage level (that is, a disable voltage level) after the GOA circuit 10 finishes a charging for the horizontal scanning lines (that is, finishing a "All Gate on" function) simultaneously through the starting pulse signal STV such that a redundant pulse signal generated on the horizontal scanning lines before the gate driving signal GATE (1) of the first stage GOA unit 11 is outputted is avoided.

Figure 2:
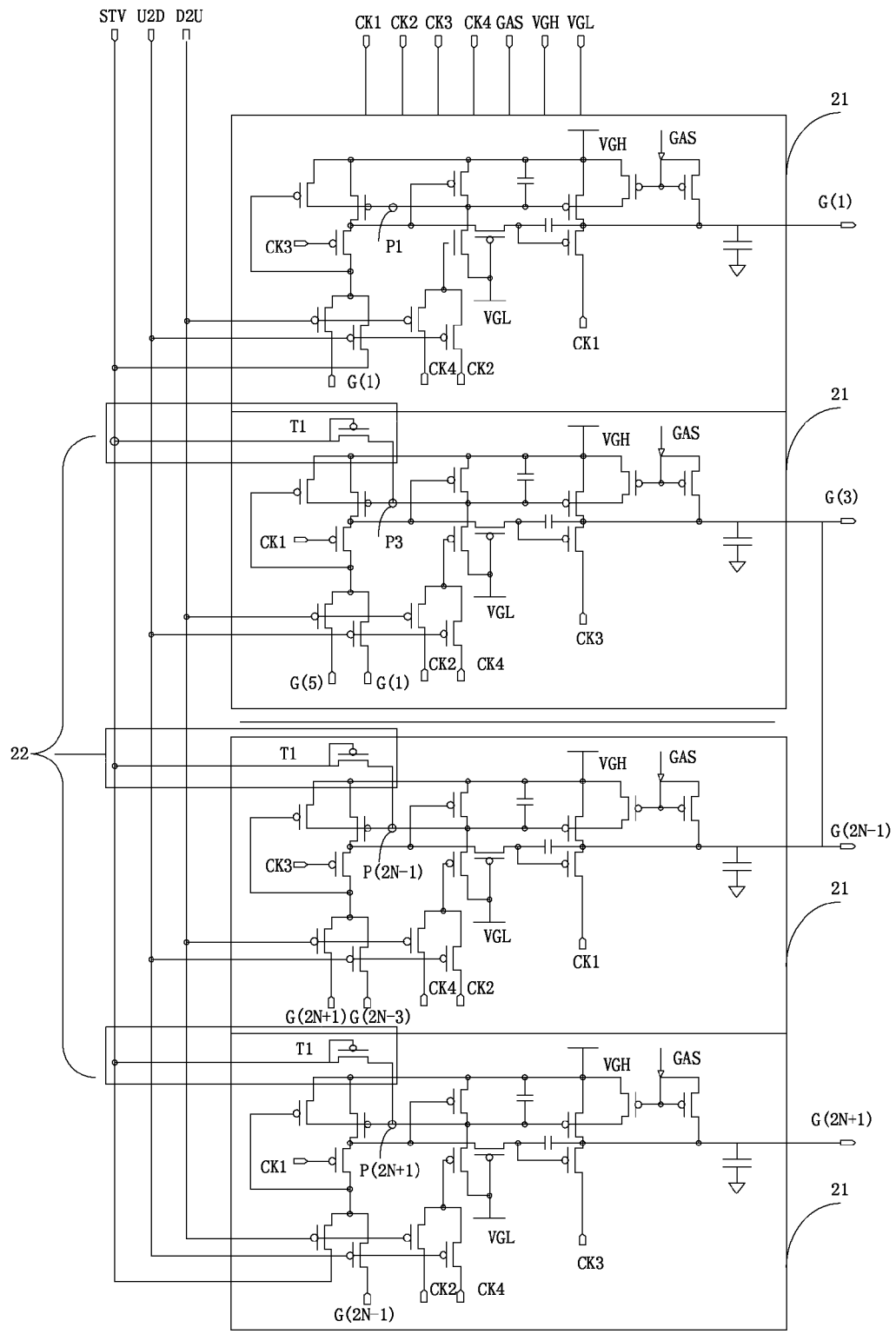
FIG. 2 is a schematic structure diagram of a GOA circuit according to a second embodiment of the present invention.

FIG. 2 is a schematic structure diagram of a GOA circuit according to a second embodiment of the present invention. The second embodiment of the present invention utilized a GOA circuit formed by odd stage GOA units in a cascaded arrangement as an example. Wherein, the GOA circuit is a PMOS circuit. As shown in FIG. 2, the GOA circuit 20 includes cascaded odd stage GOA units 21 and a control module 22.

Wherein, the cascaded odd stage GOA units 21 of the GOA circuit 20 means that the GOA circuit 20 is formed by a first stage, a third stage, a fifth stage, . . . , a (2N+1)th (N is a natural number) stage GOA units 21 in a cascaded arrangement.

Wherein, the GOA circuit 20 receives a first clock signal CK1, a second clock signal CK2, a third clock signal CK3, and a fourth clock signal CK4. Wherein, the first clock signal CK1, the second clock signal CK2, the third clock signal CK3, and the fourth clock signal CK4 are effective in a time-division manner in one clock period.

Figure 3:
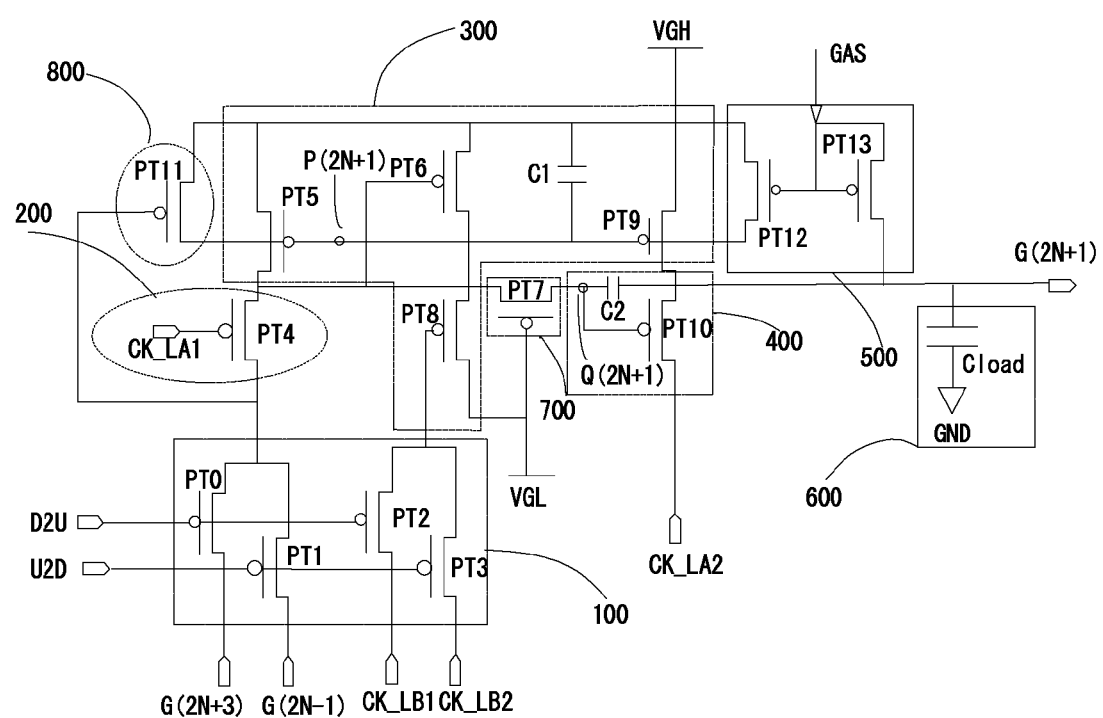
FIG. 3 is a circuit diagram of the GOA circuit shown in FIG. 2.

With reference to FIG. 3, FIG. 3 is a circuit diagram of the GOA unit of the GOA circuit shown in FIG. 2. As shown in FIG. 3, the GOA unit 21 includes a forward and backward scanning unit 100, an input control unit 200, a pull-up holding unit 300, an output control unit 400, a GAS (gate-all-select) signal function unit 500 and a bootstrap capacitor 600.

The forward and backward scanning unit 100 is used for controlling a forward driving or a backward driving of the GOA circuit 20, and under the control of the first control clock CK_LB1 and the second control clock CK_LB2, controlling a common signal node P(2N+1) to be held in a second voltage level. In the present embodiment, the second voltage level is a low voltage level.

The input control unit 200 is used for controlling an inputting of a stage-transferring signal according to the first stage-transferring clock CK_LA1 in order to finish a charging of a gate signal node Q(2N+1)(N is a natural number).

The pull-up holing unit 300 is used for controlling the gate signal node Q(2N+1) to be held in a first voltage level in a non-operation period according to the common signal node P(2N+1). In the present embodiment, the first voltage level is a high voltage level.

The output control unit 400 is used for controlling an outputting of the gate driving signal G(2N+1) corresponding to the gate signal node Q (2N+1) according to the second stage-transferring clock CK_LA2.

GAS signal function unit 500 is used for controlling the gate driving signal G(2N+1) to be in an effective voltage level in order to realize the charging of the horizontal scanning line corresponding to the GOA unit 21. In the present embodiment, the effective voltage level of the gate driving signal G(2N+1) is a low voltage level.

The bootstrap capacitor 600 is used for boosting a voltage of the gate signal node Q(2N+1) again.

Specifically, the forward and backward scanning unit 100 includes a first transistor PT0, a second transistor PT1, a third transistor PT2 and a fourth transistor PT3. A gate of the first transistor PT0 receives a first scanning control signal, that is, a backward scanning control signal D2U. A source of the first transistor PT0 receives a gate driving signal G(2N+3) outputted from a next stage GOA unit 21. A gate of the second transistor PT1 receives a second scanning control signal, that is, a forward scanning control signal U2D. A source of the second transistor PT1 receives a gate driving signal G(2N−1) outputted from a previous stage GOA unit. A drain of the first transistor PT0 and a drain of the second transistor PT1 are connected with each other and are connected with the input control unit 200. A gate of the third transistor PT2 receives the first control clock CK_LB1, a gate of the fourth transistor PT3 receives the second scanning control signal, that is, the forward scanning control signal U2D. A source of the fourth transistor PT3 receives the second control clock CK_LB2. A drain of the third transistor PT2 and a drain of the fourth transistor PT3 are connected with each other and are connected with the pull-up holding unit 300.

Wherein, in the first stage GOA unit, a source of the second transistor PT1 receives the starting pulse signal STV. In the last GOA unit, a source of the first transistor PT0 receives the starting pulse signal STV.

The input control unit 200 includes a fifth transistor PT4. A gate of the fifth transistor PT4 receives the first stage-transferring clock CK_LA1, a source of the fifth transistor PT4 is connected with a drain of the first transistor PT0 and a drain of the second transistor PT1. A drain of the fifth transistor PT4 is connected with the gate signal node Q(2N+1).

The pull-up holding unit 300 includes a sixth transistor PT5, a seventh transistor PT6, a ninth transistor PT8, a tenth transistor PT9 and a first capacitor C1. A gate of the sixth transistor PT5 is connected with the common signal node P(2N+1). A source of the sixth transistor PT5 is connected with a drain of the fifth transistor PT4. A drain of the sixth transistor PT5 is connected with a first constant voltage source, that is, a positive constant voltage source VGH. A gate of the seventh transistor PT6 is connected with a drain of the fifth transistor PT4. A source of the seventh transistor PT6 is connected with the common signal node P(2N+1).

A drain of the seventh transistor PT6 is connected with the first constant voltage source, that is, the positive constant voltage source VGH. A gate of the ninth transistor PT8 is connected with a drain of the third transistor PT2 and a drain of the fourth transistor PT3. A source of the ninth transistor PT8 is connected with a second constant voltage source, that is, a negative constant voltage source VGL. A drain of the ninth transistor PT8 is connected with the common signal node P(2N+1). A gate of the ninth transistor PT9 is connected with the common signal node P(2N+1). A source of the ninth transistor PT9 is connected with the gate driving signal G(2N+1). A drain of the tenth transistor PT9 is connected with the first constant voltage source, that is, the positive constant voltage source VGH. One terminal of the first capacitor C1 is connected with the first constant voltage source, that is, the positive constant voltage source VGH. The other terminal of the first capacitor C1 is connected with the common signal node P(2N+1).

The output control unit 400 includes an eleventh transistor PT10 and a second capacitor C2. A gate of the eleventh transistor PT10 is connected with the gate signal node Q(2N+1). A drain of the eleventh transistor PT10 is connected with the gate driving signal Q(2N+1). A source of the eleventh transistor PT10 receives the second stage-transferring clock CK_LA2. One terminal of the second capacitor C2 is connected with the gate signal node Q(2N+1). The other terminal of the second capacitor C2 is connected with the gate driving signal G(2N+1).

The GAS (gate-all-select) signal function unit 500 includes a thirteenth transistor PT12 and a fourteenth transistor PT13. A gate of the thirteenth transistor PT12, a gate and a drain of the fourteenth transistor PT13 receive a GAS signal GAS. A drain of the thirteenth transistor PT12 is connected with the first constant voltage source, that is, the positive constant voltage source VGH. A source of the thirteenth transistor PT12 is connected with the common signal node P(2N+1). A source of the thirteenth transistor PT12 is connected with the gate driving signal G(2N+1).

The bootstrap capacitor unit 600 includes a bootstrap capacitor Cload. One terminal of the bootstrap capacitor Cload is connected with the gate driving signal G(2N+1), and the other terminal of the bootstrap capacitor Cload is connected to a ground signal GND.

Preferably, the GOA unit 21 further includes a voltage regulation unit 700. The voltage regulation unit 700 is used for stabilizing a voltage of the gate signal node Q(2N+1) and preventing a current leakage of the gate signal node Q(2N+1). Specifically, the voltage regulation unit 700 includes an eighth transistor PT7. The eighth transistor PT7 is connected in series between a source of the fifth transistor PT4 and the gate signal node Q(2N+1). A gate of the eighth transistor PT7 is connected with the second constant voltage source, that is, the negative constant voltage source VGL. A drain of the eighth transistor PT7 and a drain of the fifth transistor PT4 are connected. A source of the eighth transistor PT7 is connected with the gate signal node Q(2N+1).

Preferably, the GOA unit 21 further includes a pull-up auxiliary unit 800. The pull-up auxiliary unit 800 is used for preventing a current leakage problem in a charging process for the gate signal node Q(2N+1) by the fifth transistor PT4 and the sixth transistor PT5. Specifically, the pull-up auxiliary unit 800 includes a twelfth transistor PT11. A gate of the twelfth transistor PT11 is connected with the drain of the first transistor PT0 and a drain of the second transistor PT1. A source of the twelfth transistor PT11 is connected with the common signal node P(2N+1). A drain of the twelfth transistor PT11 is connected with the first constant voltage source, that is, the positive constant voltage source VGH.

In the GOA circuit 20, and in a first stage, a fifth stage, . . . , a (4N+1)th stage (N is a natural number) GOA units 21, The first stage-transferring clock CK_LA1 is the first clock signal CK1. The second stage-transferring clock CK_LA2 is a third clock signal CK3. The first control clock CK_LB1 is the second clock signal CK2. The second control clock CK_LB2 is the fourth clock signal CK4. In a third stage, a seventh stage, . . . , a (4N+3)th (N is a natural number) GOA units 21, the second stage-transferring clock CK_LA2 is the third clock signal CK3. A first stage-transferring clock CK_LA1 is the first clock signal CK1. The second control clock CK_LB2 is the fourth clock signal CK4. The first control clock CK_LB2 is the second clock signal CK2.

One person skilled in the art can understand that when the GOA circuit is a NMOS circuit, all of the transistors above are NMOS transistors. The first scanning control signal corresponds to a forward scanning control signal U2D. The second scanning control signal corresponds to a backward scanning control signal D2U. The first constant voltage source corresponds to the negative constant voltage source VGL. The second constant voltage source corresponds to the positive constant voltage source VGH.

With still reference to FIG. 2, the control module 22 includes multiple first control transistors T1 corresponding to the GOA units one by one except the first stage GOA unit 21. A first terminal and a second terminal of each first control transistor T1 are connected to receive a starting pulse signal STV. A third terminal of each first control transistor T1 is connected with a common signal node P(2N+1) of a corresponding GOA unit 21.

In the present embodiment, each first control transistor T1 is a PMOS transistor. A first terminal, a second terminal and a third terminal of the first control transistor T1 are corresponding to a gate, a source and a drain of the PMOS transistor. When the starting pulse signal STV is turned on, the starting pulse signal STV controls the common signal node P(2N+1) of each GOA unit except the first GOA unit to be located in a low voltage level such that the gate driving signals G(2N+1) on the horizontal scanning lines are reset to high voltage levels.

In the present embodiment, when the GOA circuit is a NMOS circuit, each first control transistor T1 is a NMOS transistor. A first terminal, a second terminal and a third terminal of the first control transistor T1 are corresponding to a gate, a source and a drain of the NMOS transistor. When the starting pulse signal STV is turned on, the starting pulse signal STV controls the common signal node P(2N+1) of each GOA unit except the first stage GOA unit to be located in a high voltage level such that the gate driving signals G(2N+1) on the horizontal scanning lines are reset to low voltage levels.

Figure 4:
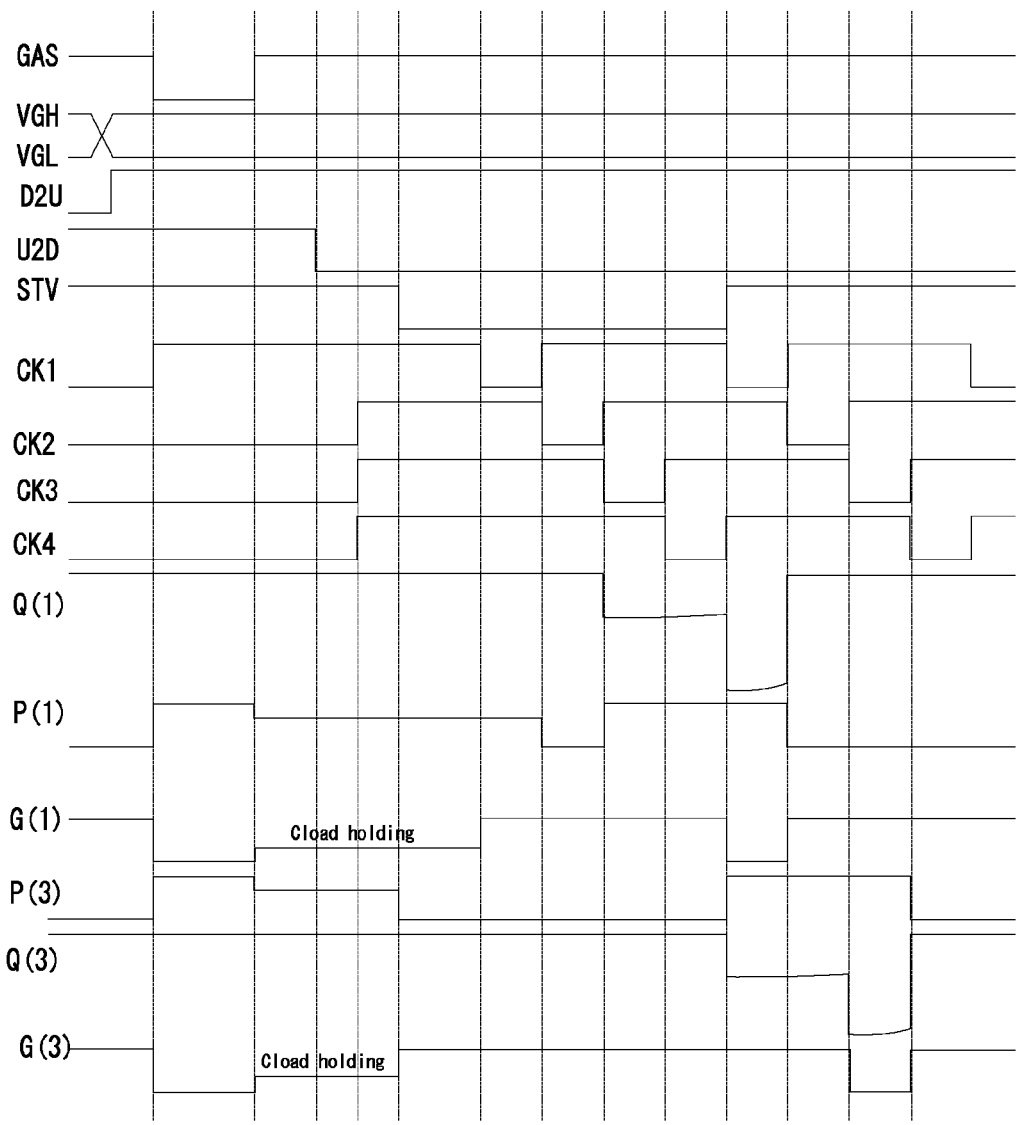
FIG. 4 is a timing diagram of the GOA circuit of the second embodiment.

FIG. 4 is a timing diagram of the GOA circuit according to a second embodiment of the present invention. The second embodiment of the present invention utilizes a GOA circuit formed by odd stage GOA units in a cascaded arrangement as an example. Wherein, the GOA circuit is a PMOS circuit. As shown in FIG. 4, when the GAS signal GAS is effective, that is, under a low voltage level, the GOA circuit 20 realizes an All-Gate-On function. The gate driving signals G(2N+1) corresponding to horizontal scanning lines of the odd stage GOA units output low voltage levels. After the GOA circuit 20 finish the All-Gate-On function, because the existence of the bootstrap capacitor Cload, the gate driving signals G(2N+1) corresponding to horizontal scanning lines of the odd stage GOA units will not become high voltage levels immediately, but be held in low voltage levels as the Cload holding.

Using a forward driving for the GOA circuit as an example, if the gate driving signals corresponding to horizontal scanning lines of the odd stage GOA units cannot be discharge to a high voltage before the third clock signal CK3 is effective, except the horizontal scanning line of the first stage GOA unit, the other horizontal scanning lines of the odd stage GOA units will generate redundant pulse signals. Specifically, the first stage horizontal scanning line is driven by the first stage GOA unit, because the stage-transferring signal of the first stage GOA unit is the starting pulse signal STV, the first stage GOA unit is driven normally, and will not generate a redundant pulse signal. The third stage horizontal scanning line is driven by the third stage GOA unit. The stage-transferring signal of the third stage GOA unit is a gate driving signal G(1) of the first stage GOA unit.

When the first clock signal CK1 is a low voltage level, because the gate driving signal G(1) is held in a low voltage level as the Cload holding, a low voltage level signal of the gate driving signal G(1) will be transferred to a gate signal node Q(3) of the third stage GOA unit such that the third stage GOA unit 21 is operated before the first stage GOA unit 21 such that a gate driving signal G(3) outputted from the third stage GOA unit 21 generates a redundant pulse. The redundant pulse will continuously affect a gate driving signal of a next stage GOA unit 21. Base on the same reason, when the first clock signal CK1 is effective, gate driving signals of a seventh stage, an eleventh stage, and a (4N+3)th stage GOA units will generate redundant pulses.

In order to avoid the above problem, as shown in FIG. 4, after the GOA circuit 20 realizes the All-Gate-On function and before the first clock signal CK1 is effective, setting the starting pulse signal STV as a low voltage level, and after the first clock signal CK1, the second clock signal CK2, the third clock signal CK3 and the fourth clock signal CK4 are effective sequentially, setting the starting pulse signal STV to be changed from a low voltage level to a high voltage level. Wherein, when the starting pulse signal STV is a low voltage level, because the first control transistor T1 is turned on, the common signal nodes P(2N+1) of the third stage, the fifth stage, the (2N+1)the stage GOA units 21 are changed from high voltage levels to low voltage levels such that before the third clock signal CK3 is effective, the gate driving signal G(2N+1) become a high voltage level in order to avoid a generation of a redundant pulse signal. Then, maintaining a normal driving sequence of the first clock signal CK1, the second clock signal CK2, the third clock signal CK3, and the fourth clock signal CK4 to drive the GOA circuit 20 so as to realize a normal charging of the horizontal scanning lines.

Figure 5:
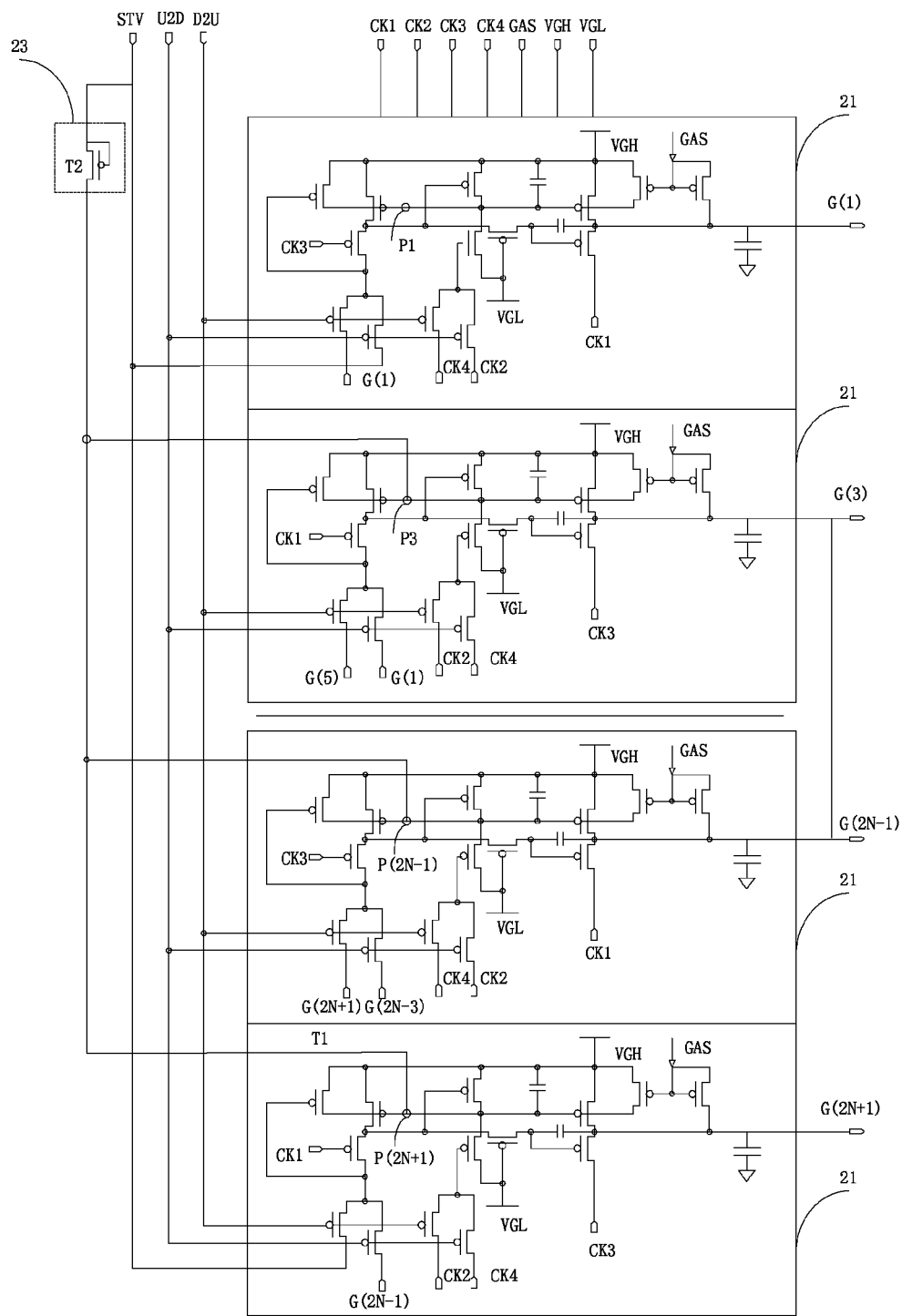
FIG. 5 is a schematic structure diagram of a GOA circuit according to a third embodiment of the present invention.

FIG. 5 is a schematic structure diagram of a GOA circuit according to a third embodiment of the present invention. The third embodiment of the present invention utilizes a GOA circuit formed by odd stage GOA units in a cascaded arrangement. Wherein, the GOA circuit is a PMOS circuit. The difference between the third embodiment shown in FIG. 5 and the second embodiment shown in FIG. 2 is:

as shown in FIG. 5, the control module 23 includes a second control transistor T2. A first terminal and a second terminal of the second control transistor T2 are connected to receive the staring pulse signal STV. A third terminal of the second control transistor T2 is connected with the common signal nodes P(2N+1) of the multiple GOA units 21 except the first stage GOA unit 21.

In the present embodiment, the second control transistor T2 is a PMOS transistor. A first terminal, a second terminal and a third terminal of the second control transistor T2 are corresponding to a gate, a source and a drain of the PMOS transistor. When the starting pulse signal STV is turned on, the starting pulse signal STV controls the common signal node P(2N+1) of each GOA unit except the first stage GOA unit to be located in a low voltage level such that the gate driving signals G(2N+1) on the horizontal scanning lines are reset to high voltage levels.

In the present embodiment, when the GOA circuit is a NMOS circuit, the second control transistor T2 is a NMOS transistor. A first terminal, a second terminal and a third terminal of the second control transistor T2 are corresponding to a gate, a source and a drain of the NMOS transistor. When the starting pulse signal STV is turned on, the starting pulse signal STV controls the common signal node P(2N+1) of each GOA unit except the first stage GOA unit to be located in a high voltage level such that the gate driving signals G(2N+1) on the horizontal scanning lines are reset to low voltage levels.

Besides, the timing sequence of the GOA circuit of the third embodiment shown in FIG. 5 is the same as the timing sequence of the GOA circuit of the second embodiment shown in FIG. 2.

The person skilled in the art can understand that a liquid crystal display device includes a GOA circuit formed by odd stage GOA units in a cascaded manner and a GOA circuit formed by even stage GOA units in a cascaded manner. The operation principle of the GOA circuit formed by even stage GOA units in a cascaded manner is similar to the GOA circuit formed by odd stage GOA units in a cascaded manner. No more repeating.

The present invention further provides a liquid crystal display device including above GOA circuits.

The beneficial effect of the present invention is: the GOA circuit and the liquid crystal display device of the present invention, through the starting pulse signal to control the gate driving signals to be reset to the first voltage level, that is, an ineffective voltage level, after the GOA circuit finishes a charging for all of the horizontal scanning lines simultaneously such that a redundant pulse signal generated on the horizontal scanning lines before the gate driving signal of the first stage GOA unit is outputted is avoided.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A Gate on Array (GOA) circuit applied in a liquid crystal display device, comprising: multiple cascaded GOA units, wherein, each of the multiple cascaded GOA units is used for charging a corresponding horizontal scanning line in a display area through driving of a first stage-transferring clock, a second stage-transferring clock, a first control clock and a second control clock; the first stage-transferring clock and the second stage-transferring clock are used to control an inputting of a stage-transferring signal of the GOA unit and a generation of a gate driving signal of the GOA unit; the first control clock and the second control clock are used to control the gate driving signal to be in a first voltage level; wherein, the stage-transferring signal is a starting pulse signal or agate driving signal of an adjacent GOA unit;

the GOA unit includes a forward and backward scanning unit, an input control unit, a pull-up holding unit, an output control unit, a GAS (gate-all-select) signal function unit and a bootstrap capacitor unit;

the forward and backward scanning unit is used for controlling a forward driving or a backward driving of the GOA circuit, and under the control of the first control clock and the second control clock, controlling a common signal node to be held in a second voltage level;

the input control unit is used for controlling the inputting of the stage-transferring signal according to the first stage-transferring clock in order to finish a charging of a gate signal node;

the pull-up holding unit is used for controlling the gate signal node to be held in a first voltage level in a non-operation period according to the common signal node;

the output control unit is used for controlling an outputting of the gate driving signal corresponding to the gate signal node according to the second stage-transferring clock;

the GAS signal function unit is used for controlling the gate driving signal to be in the second voltage level in order to realize the charging of the horizontal scanning line corresponding to the GOA unit; and the bootstrap capacitor is used for boosting a voltage of the gate signal node again;

the forward and backward scanning unit includes a first transistor, a second transistor, a third transistor and a fourth transistor; a gate of the first transistor receives a first scanning control signal; a source of the first transistor receives a gate driving signal outputted from a next stage GOA unit; a gate of the second transistor receives a second scanning control signal; a source of the second transistor receives a gate driving signal outputted from a previous stage GOA unit; a drain of the first transistor and a drain of the second transistor are connected with each other and are connected with the input control unit; a gate of the third transistor receives the first control clock; a gate of the fourth transistor receives the second scanning control signal; a source of the fourth transistor receives the second control clock; a drain of the third transistor and a drain of the fourth transistor are connected with each other and are connected with the pull-up holding unit;

the input control unit includes a fifth transistor; a gate of the fifth transistor receives the first stage-transferring clock; a source of the fifth transistor is connected with a drain of the first transistor and a drain of the second transistor; a drain of the fifth transistor is connected with the gate signal node;

the pull-up holding unit includes a sixth transistor, a seventh transistor, a ninth transistor, a tenth transistor and a first capacitor; a gate of the sixth transistor is connected with the common signal node; a source of the sixth transistor is connected with a drain of the fifth transistor; a drain of the sixth transistor is connected with a first constant voltage source; a gate of the seventh transistor is connected with a drain of the fifth transistor; a source of the seventh transistor is connected with the common signal node; a drain of the seventh transistor is connected with the first constant voltage source, that is, the positive constant voltage source; a gate of the ninth transistor is connected with a drain of the third transistor and a drain of the fourth transistor; a source of the ninth transistor is connected with a second constant voltage source; a drain of the ninth transistor is connected with the common signal node; a gate of the ninth transistor is connected with the common signal node; a source of the ninth transistor is connected with the gate driving signal; a drain of the tenth transistor is connected with the first constant voltage source; one terminal of the first capacitor is connected with the first constant voltage source; the other terminal of the first capacitor is connected with the common signal node;

the output control unit includes an eleventh transistor and a second capacitor; a gate of the eleventh transistor is connected with the gate signal node; a drain of the eleventh transistor is connected with the gate driving signal; a source of the eleventh transistor receives the second stage-transferring clock; one terminal of the second capacitor is connected with the gate signal node; the other terminal of the second capacitor is connected with the gate driving signal;

the GAS (gate-all-select) signal function unit includes a thirteenth transistor and a fourteenth transistor; a gate of the thirteenth transistor, a gate and a drain of the fourteenth transistor receive a GAS signal; a drain of the thirteenth transistor is connected with the first constant voltage source; a source of the thirteenth transistor is connected with the common signal node; a source of the of the thirteenth transistor is connected with the gate driving signal;

the bootstrap capacitor unit includes a bootstrap capacitor; one terminal of the bootstrap capacitor is connected with the gate driving signal, and the other terminal of the bootstrap capacitor is connected to a ground signal;

the GOA unit further includes a voltage regulation unit and a pull-up auxiliary unit; the voltage regulation unit includes an eighth transistor; the eighth transistor is connected in series between a source of the fifth transistor and the gate signal node; a gate of the eighth transistor is connected with the second constant voltage source; a drain of the eighth transistor and a drain of the fifth transistor are connected; a source of the eighth transistor is connected with the gate signal node; the pull-up auxiliary unit includes a twelfth transistor; a gate of the twelfth transistor is connected with the drain of the first transistor and a drain of the second transistor; a source of the twelfth transistor is connected with the common signal node; a drain of the twelfth transistor is connected with the positive constant voltage source;

the GOA circuit further includes a control module used to control the gate driving signals except the gate driving signal of the first stage GOA unit to be reset to the first voltage level after the GOA circuit finishes a charging for all of the horizontal scanning lines simultaneously through the starting pulse signal such that a redundant pulse signal generated on the horizontal scanning lines before the gate driving signal of the first stage GOA unit is outputted is avoid; and the control module includes multiple first control transistors corresponding to the GOA units one by one except the first stage GOA unit; a first terminal and a second terminal of each first control transistor are connected to receive the starting pulse signal; a third terminal of each first control transistor is connected with the common signal node of a corresponding GOA unit.

2. The GOA circuit according to claim 1, wherein, each first control transistor is a PMOS transistor; a first terminal, a second terminal and a third terminal of the first control transistor are corresponding to a gate, a source and a drain of the PMOS transistor; when the starting pulse signal is turned on, the starting pulse signal controls the common signal node of each GOA unit except the first stage GOA unit to be located in a low voltage level such that the gate driving signals on the horizontal scanning lines are reset to high voltage levels.

3. A Gate on Array (GOA) circuit applied in a liquid crystal display device, comprising:

multiple cascaded GOA units, wherein, each of the multiple cascaded GOA units is used for charging a corresponding horizontal scanning line in a display area through driving of a first stage-transferring clock, a second stage-transferring clock, a first control clock and a second control clock; the first stage-transferring clock and the second stage-transferring clock are used to control an inputting of a stage-transferring signal of the GOA unit and a generation of a gate driving signal of the GOA unit; the first control clock and the second control clock are used to control the gate driving signal to be in a first voltage level; wherein, the stage-transferring signal is a starting pulse signal or a gate driving signal of an adjacent GOA unit; and a control module used to control the gate driving signals except the gate driving signal of the first stage GOA unit to be reset to the first voltage level after the GOA circuit finishes a charging for all of the horizontal scanning lines simultaneously through the starting pulse signal such that a redundant pulse signal generated on the horizontal scanning lines before the gate driving signal of the first stage GOA unit is outputted is avoided.

4. The GOA circuit according to claim 3, wherein, the GOA unit includes a forward and backward scanning unit, an input control unit, a pull-upholding unit, an output control unit, a GAS (gate-all-select) signal function unit and a bootstrap capacitor unit;

the forward and backward scanning unit is used for controlling a forward driving or a backward driving of the GOA circuit, and under the control of the first control clock and the second control dock, controlling a common signal node to be held in a second voltage level;

the input control unit is used for controlling the inputting of the stage-transferring signal according to the first stage-transferring dock in order to finish a charging of a gate signal node;

the pull-up holding unit is used for controlling the gate signal node to be hold in a first voltage level in a non-operation period according to the common signal node;

the output control unit is used for controlling an outputting of the gate driving signal corresponding to the gate signal node according to the second stage-transferring dock;

the GAS signal function unit is used for controlling the gate driving signal to be in the second voltage level in order to realize the charging of the horizontal scanning line corresponding to the GOA unit; and the bootstrap capacitor is used for boosting a voltage of the gate signal node again.

5. The GOA circuit according to claim 4, wherein, the control module includes multiple first control transistors corresponding to the GOA units one by one except the first stage GOA unit; a first terminal and a second terminal of each first control transistor are connected to receive the starting pulse signal; a third terminal of each first control transistor is connected with a common signal node of a corresponding GOA unit.

6. The GOA circuit according to claim 5, wherein, each first control transistor is a PMOS transistor; a first terminal, a second terminal and a third terminal of the first control transistor are corresponding to a gate, a source and a drain of the PMOS transistor; when the starting pulse signal is turned on, the starting pulse signal controls the common signal node of each GOA unit except the first stage GOA unit to be located in a low voltage level such that the gate driving signals on the horizontal scanning lines are reset to high voltage levels.

7. The GOA circuit according to claim 5, wherein, each first control transistor is a NMOS transistor; a first terminal, a second terminal and a third terminal of the first control transistor are corresponding to a gate, a source and a drain of the NMOS transistor; when the starting pulse signal is turned on, the starting pulse signal controls the common signal node of each GOA unit except the first stage GOA unit to be located in a high voltage level such that the gate driving signals on the horizontal scanning lines are reset to low voltage levels.

8. The GOA circuit according to claim 4, wherein, the control module includes a second control transistor; a first terminal and a second terminal of the second control transistor are connected to receive the staring pulse signal; a third terminal of the second control transistor is connected with the common signal nodes of the multiple GOA units except the first stage GOA unit.

9. The GOA circuit according to claim 8, wherein, the second control transistor is a PMOS transistor; a first terminal, a second terminal and a third terminal of the second control transistor are corresponding to a gate, a source and a drain of the PMOS transistor; when the starting pulse signal is turned on, the starting pulse signal controls the common signal node of each GOA unit except the first stage GOA unit to be located in a low voltage level such that the gate driving signals on the horizontal scanning lines are reset to high voltage levels.

10. The GOA circuit according to claim 8, wherein, the second control transistor is a NMOS transistor; a first terminal, a second terminal and a third terminal of the second control transistor are corresponding to a gate, a source and a drain of the NMOS transistor; when the starting pulse signal is turned on, the starting pulse signal controls the common signal node of each GOA unit except the first stage GOA unit to be located in a high voltage level such that the gate driving signals on the horizontal scanning lines are reset to low voltage levels.

11. The GOA circuit according to claim 4, wherein, the forward and backward scanning unit includes a first transistor, a second transistor, a third transistor and a fourth transistor; a gate of the first transistor receives a first scanning control signal; a source of the first transistor receives a gate driving signal outputted from a next stage GOA unit; a gate of the second transistor receives a second scanning control signal; a source of the second transistor receives a gate driving signal outputted from a previous stage GOA unit; a drain of the first transistor and a drain of the second transistor are connected with each other and are connected with the input control unit; a gate of the third transistor receives the first control clock; a gate of the fourth transistor receives the second scanning control signal; a source of the fourth transistor receives the second control clock; a drain of the third transistor and a drain of the fourth transistor are connected with each other and are connected with the pull-up holding unit;

the input control unit includes a fifth transistor; a gate of the fifth transistor receives the first stage-transferring clock; a source of the fifth transistor is connected with a drain of the first transistor and a drain of the second transistor; a drain of the fifth transistor is connected with the gate signal node;

the pull-up holding unit includes a sixth transistor, a seventh transistor, a ninth transistor, a tenth transistor and a first capacitor; a gate of the sixth transistor is connected with the common signal node; a source of the sixth transistor is connected with a drain of the fifth transistor; a drain of the sixth transistor is connected with a first constant voltage source; a gate of the seventh transistor is connected with a drain of the fifth transistor; a source of the seventh transistor is connected with the common signal node; a drain of the seventh transistor is connected with the first constant voltage source, that is, the positive constant voltage source; a gate of the ninth transistor is connected with a drain of the third transistor and a drain of the fourth transistor; a source of the ninth transistor is connected with a second constant voltage source; a drain of the ninth transistor is connected with the common signal node; a gate of the ninth transistor is connected with the common signal node; a source of the ninth transistor is connected with the gate driving signal; a drain of the tenth transistor is connected with the first constant voltage source; one terminal of the first capacitor is connected with the first constant voltage source; the other terminal of the first capacitor is connected with the common signal node;

the output control unit includes an eleventh transistor and a second capacitor; a gate of the eleventh transistor is connected with the gate signal node; a drain of the eleventh transistor is connected with the gate driving signal; a source of the eleventh transistor receives the second stage-transferring clock; one terminal of the second capacitor is connected with the gate signal node; the other terminal of the second capacitor is connected with the gate driving signal;

the GAS (gate-all-select) signal function unit includes a thirteenth transistor and a fourteenth transistor; a gate of the thirteenth transistor, a gate and a drain of the fourteenth transistor receive a GAS signal; a drain of the thirteenth transistor is connected with the first constant voltage source; a source of the thirteenth transistor is connected with the common signal node; a source of the of the thirteenth transistor is connected with the gate driving signal;

the bootstrap capacitor unit includes a bootstrap capacitor; one terminal of the bootstrap capacitor is connected with the gate driving signal, and the other terminal of the bootstrap capacitor is connected to a ground signal; and the GOA unit further includes a voltage regulation unit and a pull-up auxiliary unit; the voltage regulation unit includes an eighth transistor; the eighth transistor is connected in series between a source of the fifth transistor and the gate signal node; a gate of the eighth transistor is connected with the second constant voltage source; a drain of the eighth transistor and a drain of the fifth transistor are connected; a source of the eighth transistor is connected with the gate signal node; the pull-up auxiliary unit includes a twelfth transistor; a gate of the twelfth transistor is connected with the drain of the first transistor and a drain of the second transistor; a source of the twelfth transistor is connected with the common signal node; a drain of the twelfth transistor is connected with the positive constant voltage source.

12. A liquid crystal display device including a Gate on Array (GOA) circuit, and the GOA circuit comprises:

multiple cascaded GOA units, wherein, each of the multiple cascaded GOA units is used for charging a corresponding horizontal scanning line in a display area through driving of a first stage-transferring clock, a second stage-transferring clock, a first control clock and a second control clock; the first stage-transferring clock and the second stage-transferring clock are used to control an inputting of a stage-transferring signal of the GOA unit and a generation of a gate driving signal of the GOA unit; the first control clock and the second control clock are used to control the gate driving signal to be in a first voltage level; wherein, the stage-transferring signal is a starting pulse signal or a gate driving signal of an adjacent GOA unit; and a control module used to control the gate driving signals except the gate driving signal of the first stage GOA unit to be reset to the first voltage level after the GOA circuit finishes a charging for all of the horizontal scanning lines simultaneously through the starting pulse signal such that a redundant pulse signal generated on the horizontal scanning lines before the gate driving signal of the first stage GOA unit is outputted is avoided.

13. The liquid crystal display device according to claim 12, wherein, the GOA unit includes a forward and backward scanning unit, an input control unit, a pull-up holding unit, an output control unit, a GAS (gate-all-select) signal function unit and a bootstrap capacitor unit;

the forward and backward scanning unit is used for controlling a forward driving or a backward driving of the GOA circuit, and under the control of the first control clock and the second control clock; controlling a common signal node to be held in a second voltage level;

the input control unit is used for controlling the inputting of the stage-transferring signal according to the first stage-transferring clock in order to finish a charging of a gate signal node;

the pull-up holding unit is used for controlling the gate signal node to be held in a first voltage level in a non-operation period according to the common signal node;

the output control unit is used for controlling an outputting of the gate driving signal corresponding to the gate signal node according to the second stage-transferring dock;

the GAS signal function unit is used for controlling the gate driving signal to be in the second voltage level in order to realize the charging of the horizontal scanning line corresponding to the GOA unit; and the bootstrap capacitor is used for boosting a voltage of the gate signal node again.

14. The liquid crystal display device according to claim 13, wherein, the control module includes multiple first control transistors corresponding to the GOA units one by one except the first stage GOA unit; a first terminal and a second terminal of each first control transistor are connected to receive the starting pulse signal; a third terminal of each first control transistor is connected with a common signal node of a corresponding GOA unit.

15. The liquid crystal display device according to claim 14, wherein, each first control transistor is a PMOS transistor; a first terminal, a second terminal and a third terminal of the first control transistor are corresponding to a gate, a source and a drain of the PMOS transistor; when the starting pulse signal is turned on, the starting pulse signal controls the common signal node of each GOA unit except the first stage GOA unit to be located in a low voltage level such that the gate driving signals on the horizontal scanning lines are reset to high voltage levels.

16. The liquid crystal display device according to claim 14, wherein, each first control transistor is a NMOS transistor; a first terminal, a second terminal and a third terminal of the first control transistor are corresponding to a gate, a source and a drain of the NMOS transistor; when the starting pulse signal is turned on, the starting pulse signal controls the common signal node of each GOA unit except the first stage GOA unit to be located in a high voltage level such that the gate driving signals on the horizontal scanning lines are reset to low voltage levels.

17. The liquid crystal display device according to claim 13, wherein, the control module includes a second control transistor; a first terminal and a second terminal of the second control transistor are connected to receive the staring pulse signal; a third terminal of the second control transistor is connected with the common signal nodes of the multiple GOA units except the first stage GOA unit.

18. The liquid crystal display device according to claim 17, wherein, the second control transistor is a PMOS transistor; a first terminal, a second terminal and a third terminal of the second control transistor are corresponding to a gate, a source and a drain of the PMOS transistor; when the starting pulse signal is turned on, the starting pulse signal controls the common signal node of each GOA unit except the first stage GOA unit to be located in a low voltage level such that the gate driving signals on the horizontal scanning lines are reset to high voltage levels.

19. The liquid crystal display device according to claim 17, wherein, the second control transistor is a NMOS transistor; a first terminal, a second terminal and a third terminal of the second control transistor are corresponding to a gate, a source and a drain of the NMOS transistor; when the starting pulse signal is turned on, the starting pulse signal controls the common signal node of each GOA unit except the first stage GOA unit to be located in a high voltage level such that the gate driving signals on the horizontal scanning lines are reset to low voltage levels.

20. The liquid crystal display device according to claim 13, wherein, the forward and backward scanning unit includes a first transistor, a second transistor, a third transistor and a fourth transistor; a gate of the first transistor receives a first scanning control signal; a source of the first transistor receives a gate driving signal outputted from a next stage GOA unit; a gate of the second transistor receives a second scanning control signal; a source of the second transistor receives a gate driving signal outputted from a previous stage GOA unit; a drain of the first transistor and a drain of the second transistor are connected with each other and are connected with the input control unit; a gate of the third transistor receives the first control clock; a gate of the fourth transistor receives the second scanning control signal; a source of the fourth transistor receives the second control clock; a drain of the third transistor and a drain of the fourth transistor are connected with each other and are connected with the pull-up holding unit;

the input control unit includes a fifth transistor; a gate of the fifth transistor receives the first stage-transferring clock; a source of the fifth transistor is connected with a drain of the first transistor and a drain of the second transistor; a drain of the fifth transistor is connected with the gate signal node;

the pull-up holding unit includes a sixth transistor, a seventh transistor, a ninth transistor, a tenth transistor and a first capacitor; a gate of the sixth transistor is connected with the common signal node; a source of the sixth transistor is connected with a drain of the fifth transistor; a drain of the sixth transistor is connected with a first constant voltage source; a gate of the seventh transistor is connected with a drain of the fifth transistor; a source of the seventh transistor is connected with the common signal node; a drain of the seventh transistor is connected with the first constant voltage source, that is, the positive constant voltage source; a gate of the ninth transistor is connected with a drain of the third transistor and a drain of the fourth transistor; a source of the ninth transistor is connected with a second constant voltage source; a drain of the ninth transistor is connected with the common signal node; a gate of the ninth transistor is connected with the common signal node; a source of the ninth transistor is connected with the gate driving signal; a drain of the tenth transistor is connected with the first constant voltage source; one terminal of the first capacitor is connected with the first constant voltage source; the other terminal of the first capacitor is connected with the common signal node;

the output control unit includes an eleventh transistor and a second capacitor; a gate of the eleventh transistor is connected with the gate signal node; a drain of the eleventh transistor is connected with the gate driving signal; a source of the eleventh transistor receives the second stage-transferring clock; one terminal of the second capacitor is connected with the gate signal node; the other terminal of the second capacitor is connected with the gate driving signal;

the GAS (gate-all-select) signal function unit includes a thirteenth transistor and a fourteenth transistor; a gate of the thirteenth transistor, a gate and a drain of the fourteenth transistor receive a GAS signal; a drain of the thirteenth transistor is connected with the first constant voltage source; a source of the thirteenth transistor is connected with the common signal node; a source of the of the thirteenth transistor is connected with the gate driving signal;

the bootstrap capacitor unit includes a bootstrap capacitor; one terminal of the bootstrap capacitor is connected with the gate driving signal, and the other terminal of the bootstrap capacitor is connected to a ground signal; and the GOA unit further includes a voltage regulation unit and a pull-up auxiliary unit; the voltage regulation unit includes an eighth transistor; the eighth transistor is connected in series between a source of the fifth transistor and the gate signal node; a gate of the eighth transistor is connected with the second constant voltage source; a drain of the eighth transistor and a drain of the fifth transistor are connected; a source of the eighth transistor is connected with the gate signal node; the pull-up auxiliary unit includes a twelfth transistor; a gate of the twelfth transistor is connected with the drain of the first transistor and a drain of the second transistor; a source of the twelfth transistor is connected with the common signal node; a drain of the twelfth transistor is connected with the positive constant voltage source.

* * * * *